(12) United States Patent
Nagara et al.

(10) Patent No.: US 7,854,998 B2
(45) Date of Patent: Dec. 21, 2010

(54) ORGANIC EL DEVICES

(75) Inventors: Yoshiaki Nagara, Aichi (JP); Ichiro Yamamoto, Aichi (JP); Kenji Mori, Aichi (JP); Takanori Murasaki, Aichi (JP)

(73) Assignee: Kabushiki Kaisha Toyota Jidoshokki, Aichi-ken (JP)

( * ) Notice: Subject to any disclaimer, the term of this patent is extended or adjusted under 35 U.S.C. 154(b) by 1054 days.

(21) Appl. No.: 11/628,277

(22) PCT Filed: May 11, 2005

(86) PCT No.: PCT/JP2005/008601

§ 371 (c)(1),
(2), (4) Date: Nov. 30, 2006

(87) PCT Pub. No.: WO2005/117499

PCT Pub. Date: Dec. 8, 2005

(65) Prior Publication Data

US 2008/0290788 A1    Nov. 27, 2008

(30) Foreign Application Priority Data

May 31, 2004   (JP)   ............................. 2004-162042

(51) Int. Cl.
H05B 33/14   (2006.01)

(52) U.S. Cl. ..................... 428/690; 313/504; 313/506; 257/102; 257/103; 257/E51.049

(58) Field of Classification Search ............... 428/690; 313/504, 506; 257/102, 103, E51.049
See application file for complete search history.

(56) References Cited

U.S. PATENT DOCUMENTS

| | | | |
|---|---|---|---|
| 2002/0197511 A1 | 12/2002 | D'Andrade et al. | |
| 2003/0076032 A1 | 4/2003 | Suzuri et al. | |
| 2004/0046495 A1 | 3/2004 | Peng | |
| 2004/0124766 A1* | 7/2004 | Nakagawa et al. | 313/504 |
| 2004/0154542 A1* | 8/2004 | Yamazaki et al. | 118/723 MP |
| 2005/0249972 A1* | 11/2005 | Hatwar et al. | 428/690 |

FOREIGN PATENT DOCUMENTS

| | | |
|---|---|---|
| EP | 1 414 081 A2 | 4/2004 |
| JP | 08-078163 A | 3/1996 |

(Continued)

OTHER PUBLICATIONS

Lee et al. Materials Science and Engineering B95 (2002) 24-28.*
Japanese Office Action mailed on Mar. 31, 2009, for Japanese Patent Application No. 2006-513836 (partial translation provided).

(Continued)

*Primary Examiner*—David Wu
*Assistant Examiner*—Vu A Nguyen
(74) *Attorney, Agent, or Firm*—Locke Lord Bissell & Liddell LLP (57) ABSTRACT

The present organic EL devices have at least one luminescent layer and a cathode sequentially provided on their anode, which luminescent layer contains an electron-transporting material, a hole-transporting material, and a luminescent dopant. Preferably, an electron-transporting layer is further provided between the luminescent layer and the cathode. According to the present invention, organic EL devices can be provided giving improved whiteness, colour reproducibility, luminescent efficiency, and lifetime compared to conventional ones.

9 Claims, 1 Drawing Sheet

FOREIGN PATENT DOCUMENTS

| | | |
|---|---|---|
| JP | 10-003990 | 1/1998 |
| JP | 2000-068057 | 3/2000 |
| JP | 2001-313180 | 11/2001 |
| JP | 2002-175879 | 6/2002 |
| JP | 2002-313583 | 10/2002 |
| JP | 2003-229265 | 8/2003 |
| JP | 2003-272857 | 9/2003 |
| JP | 2003-282266 | 10/2003 |
| JP | 2004-006165 | 1/2004 |
| JP | 2004-059733 A | 2/2004 |
| WO | 02/091814 A2 | 11/2002 |

OTHER PUBLICATIONS

Taiwanese Office Action dated Apr. 16, 2008, received in corresponding Taiwanese Patent Application No. 0972019426001 without English translation.

Korean Office Action dated Apr. 15, 2008, received in corresponding Korean Patent Application No. 2006-7025258 without English translation.

Chinese Office Action dated May 23, 2008, received in corresponding Chinese Patent Application No. 200580024650.9 with English translation.

Supplementary European Search Report of EP 05 73 9258—Dated Jul. 22, 2009.

* cited by examiner

FIG. 1

ORGANIC EL DEVICES

This application claims the benefit under 35 U.S.C §119 (a)-(d) or 365(b) of Japanese Patent Application No. JP 2004-162042, filed on May 31, 2004.

TECHNICAL FIELD

The present invention relates to organic EL devices having on their anode at least one luminescent layer and a cathode sequentially laminated.

BACKGROUND ART

Conventionally, organic EL devices have been known which have luminescent layer(s), containing organic luminescent materials, provided between opposing electrodes (an anode and a cathode) wherein the luminescent layer(s) generate(s) light (electro-luminescence, EL) by passing the electric current between these electrodes. Amongst such organic EL devices, JP2000-68057A discloses organic EL devices having two luminescent layers laminated on their anode.

JP10-3990A discloses organic EL devices having a blue luminescent layer, a green luminescent layer, a red luminescent layer, and a cathode sequentially laminated on their anode.

JP2002-175879A discloses organic EL devices having a red luminescent layer, a green luminescent layer, a blue luminescent layer, and a cathode sequentially laminated on their anode.

JP2001-313180A discloses organic EL devices having a carrier-transporting buffer layer provided between such luminescent layers.

DISCLOSURE OF THE INVENTION

However, organic EL devices having only two luminescent layers have a problem of low colour reproducibility. Even if organic EL devices have three luminescent layers, even if a blue luminescent layer, a green luminescent layer, and a red luminescent layer are sequentially laminated on the anode, and also even if a red luminescent layer, a green luminescent layer, and a blue luminescent layer are sequentially laminated on the anode, there has been a problem of low luminescent efficiency. Further, even if a carrier-transporting buffer layer is provided between luminescent layers of such organic EL devices, it is difficult to obtain practically satisfactory chromaticity, colour reproducibility, luminescent efficiency, long lifetime, etc.

Considering the above problems, the object of the present invention is to provide organic EL devices having improved chromaticity, colour reproducibility, luminescent efficiency, and long lifetime compared to conventional organic EL devices.

In order to achieve the above object, the first organic EL devices of the present invention have at least a red luminescent layer, a blue luminescent layer, a green luminescent layer, and a cathode sequentially provided on their anode in this order wherein the blue and green luminescent layers contain at least one common derivative to improve whiteness, colour reproducibility, luminescent efficiency, and long lifetime.

In the first organic EL devices of the present invention, an electron-transporting layer is preferably provided between the green luminescent layer and the cathode.

In the first organic EL devices of the present invention, the at least one common derivative to be contained in the blue luminescent layer and in the green luminescent layer is preferably selected from the group consisting of distyryl arylene derivatives, metal-quinolinolate complexes, pyrene derivatives, perylene derivatives, distyrylamine derivatives, anthracene derivatives, carbazole derivatives, silole derivatives, and triphenylamine derivatives.

As the common derivative is contained in the blue luminescent layer and in the green luminescent layer, luminescent efficiency and lifetime are improved. The reasons for this are:

1. The blue luminescent layer and the green luminescent layer have a similar structure resulting in no possibility of exciplexes or CT complexes forming between these layers; and 2. The gap between the energy levels of the host materials of the blue luminescent layer and the green luminescent layer becomes smaller resulting in more smooth transport of carriers such as electrons and holes between these layers.

In the first organic EL devices of the present invention, hosts of the blue luminescent layer and the green luminescent layer preferably contain at least one common derivative.

Further, in the first organic EL devices of the present invention, the hosts of the blue luminescent layer and the green luminescent layer are preferably selected from the group consisting of distyryl arylene derivatives, metal-quinolinolate complexes, pyrene derivatives, perylene derivatives, anthracene derivatives, carbazole derivatives, silole derivatives, and triphenylamine derivatives.

Also in these first organic EL devices of the present invention, dopants of the blue luminescent layer and the green luminescent layer preferably contain at least one common derivative.

Further, in these first organic EL devices of the present invention, the dopants of the blue luminescent layer and the green luminescent layer are preferably selected from the group consisting of metal-quinolinolate complexes, pyrene derivatives, perylene derivatives, distyrylamine derivatives, anthracene derivatives, silole derivatives, and triphenylamine derivatives.

Additionally in these first organic EL devices of the present invention, the dopants of the blue luminescent layer and the green luminescent layer preferably contain the derivative with the highest fluorescence quantum yield amongst the derivatives contained in the blue luminescent layer and in the green luminescent layer, respectively.

Further, in these first organic EL devices of the present invention, the dopants of the blue luminescent layer and the green luminescent layer are preferably selected from the group consisting of metal-quinolinolate complexes, pyrene derivatives, perylene derivatives, distyrylamine derivatives, anthracene derivatives, silole derivatives, and triphenylamine derivatives.

Also in these first organic EL devices of the present invention, a blocking layer is preferably provided between the red luminescent layer and the blue luminescent layer.

Additionally in the first organic EL devices of the present invention, the electron-transporting layer may consist of one layer.

Further in the first organic EL devices of the present invention, the electron-transporting layer may consist of two layers, the layer which is nearer to the anode may be made of aluminium tris(8-quinolinolate) and the layer which is nearer to the cathode may be made of a phenanthroline derivative or a triphenylmethane derivative.

Also in the first organic EL devices of the present invention, the electron-transporting layer may be a layer made of a mixture of a plurality of derivatives.

Additionally in the first organic EL devices of the present invention, the electron-transporting layer preferably contains at least one metal complex.

Further, the first organic EL devices of the present invention may contain a phosphorescent material.

In order to achieve the above object, the second organic EL devices of the present invention have at least one luminescent layer and a cathode sequentially provided on their anode wherein the luminescent layer contains an electron-transporting material, a hole-transporting material, and a luminescent dopant.

Also in the second organic EL devices of the present invention, an electron-transporting layer is preferably provided between the luminescent layer and the cathode.

Further in the second organic EL devices of the present invention, the electron-transporting materials of the luminescent layer and the electron-transporting layer are preferably the same.

Further in the second organic EL devices of the present invention, at least a red luminescent layer, a blue luminescent layer, a green luminescent layer, and a cathode are preferably provided sequentially on the anode. The green luminescent layer preferably contains an electron-transporting material, a hole-transporting material, and a luminescent dopant.

Further in the second organic EL devices of the present invention, the blue luminescent layer preferably contains a host material and a luminescent dopant. The blue luminescent layer and the green luminescent layer preferably contain at least one common derivative.

Further in the second organic EL devices of the present invention, the host material of the blue luminescent layer and the hole-transporting material of the green luminescent layer preferably contain at least one common derivative.

Further in the second organic EL devices of the present invention, the green luminescent layer contains preferably 3-60 weight %, more preferably 5-50 weight %, of the common derivative.

In the second organic EL devices of the present invention, the common derivative is preferably selected from the group consisting of distyryl arylene derivatives, metal-quinolinolate complexes, pyrene derivatives, perylene derivatives, distyrylamine derivatives, anthracene derivatives, silole derivatives, and triphenylamine derivatives. More preferably, the metal complexes are metal-quinolinolate complexes. Most preferably, the metal complexes are aluminium (4-phenylphenolate)bis(8-quinolinolate) and aluminium tris(8-quinolinolate).

Further in the second organic EL devices of the present invention, the blue luminescent layer preferably contains a host material and a luminescent dopant. The dopants of the blue luminescent layer and the green luminescent layer preferably contain at least one common derivative.

Further in the second organic EL devices of the present invention, the common derivative as the dopant is preferably selected from the group consisting of metal-quinolinolate complexes, pyrene derivatives, perylene derivatives, distyrylamine derivatives, anthracene derivatives, silole derivatives, and triphenylamine derivatives. More preferably, the metal complexes are metal-quinolinolate complexes. Most preferably, the metal complexes are aluminium (4-phenylphenolate)bis(8-quinolinolate) and aluminium tris(8-quinolinolate).

Further in the second organic EL devices of the present invention, the dopants of the blue luminescent layer and the green luminescent layer preferably contain the derivative with the highest fluorescence quantum yield amongst derivatives contained in the blue luminescent layer and in the green luminescent layer, respectively.

Further in the second organic EL devices of the present invention, a blocking layer is preferably provided between the red luminescent layer and the blue luminescent layer.

Further in the second organic EL devices of the present invention, the electron-transporting layer may consist of one layer.

Further in the second organic EL devices of the present invention, the electron-transporting layer may consist of two layers.

Further in the second organic EL devices of the present invention, when the electron-transporting layer consists of two layers, it is preferable that the layer nearer to the anode contains a metal-quinolinolate complex and the layer nearer to the cathode contains a phenanthroline derivative or a triphenylmethane derivative.

Further, in the second organic EL devices of the present invention, the electron-transporting layer is preferably a layer made of a mixture of a plurality of derivatives (a mixture layer).

Further in the second organic EL devices of the present invention, the electron-transporting layer preferably contains at least one metal complex.

The second organic EL devices of the present invention may contain a phosphorescent material.

In order to achieve the above object, the third organic EL devices of the present invention have at least two luminescent layers provided between their anode and cathode, both of which contain respective host materials and luminescent dopants, characterised in that the host material of the luminescent layer nearer to the cathode contains a hole-transporting material and an electron-transporting material and that the host material of the luminescent layer nearer to the anode contains the hole-transporting material.

In the third organic EL devices of the present invention, the wave length of luminescence from the luminescent layer nearer to the cathode is preferably longer than that from the luminescent layer nearer to the anode.

THE EFFECTS OF THE PRESENT INVENTION

Compared to conventional organic EL devices, the first, second, and third organic EL devices of the present invention can provide advantages such as superior chromaticity (whiteness), superior colour reproducibility, less changes in chromaticity (whiteness) upon measuring lifetime, etc., and improved luminescent efficiency and lifetime.

BEST MODE FOR CARRYING OUT THE INVENTION

Figure 1:
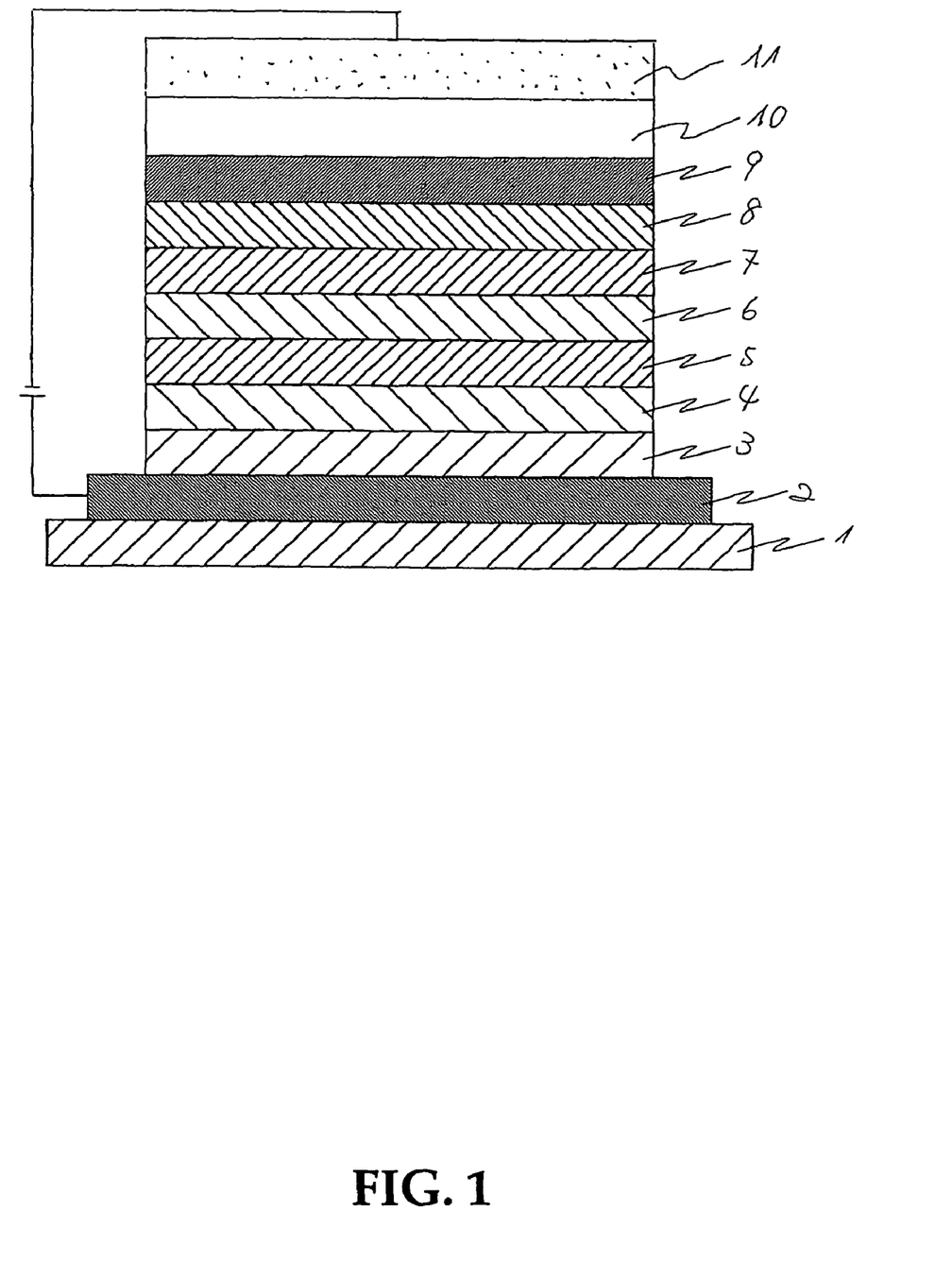
FIG. 1 (FIG. 1) is a cross sectional figure to explain examples of the layer constitution of the present organic EL devices.

Hereinafter, embodiments of the present organic EL devices will be detailed with reference to FIG. 1.

Layer Constitution

The present organic EL devices have constitutions wherein at least one luminescent layer (5, 7, and 8) and cathode (1) are sequentially laminated on an anode (2).

Substrate

Substrate (1) is usually in a plate form to support the present organic EL devices. In general, organic EL devices consist of very thin layers and thus are prepared on the support of such a substrate.

Since the present organic EL devices are formed on substrate (1), it is preferably planar and smooth.

In cases where substrate (1) is on the light-emitting side, substrate (1) should be transparent to light to be emitted.

Any known substrates can be used as substrate (1) if they have the above properties. In general, ceramic substrates such as glass substrates, silicon substrates, quartz substrates, etc.; plastic substrates; etc., are selected. Substrates wherein metal foil is deposited onto a metal substrate or support can be used. Further, substrates consisting of a composite sheet of a plurality of same or different substrates can also be used.

Anode

Anode (2) is an electrode to inject holes into the present organic EL devices. Accordingly, materials for anode (2) may be any materials that impart this property to anode (2). In general, known materials are selected such as metals, alloys, electrically conductive compounds, mixtures thereof, etc.

Examples of materials for anode (2) include metal oxides and metal nitrides such as indium-tin oxides (ITO), indium-zinc oxides (IZO), tin oxides, zinc oxides, zinc-aluminium oxides, titanium nitride, etc.; metals such as gold, platinum, silver, copper, aluminium, nickel, cobalt, lead, chromium, molybdenum, tungsten, tantalum, niobium, etc.; alloys of these metals and copper iodides, etc.; conductive polymers such as polyanilines, polythiophenes, polypyrroles, polyphenylene vinylenes, poly(3-methylthiophene), polyphenylene sulphides, etc.

In cases where anode (2) is provided on the light-emitting side relatively to luminescent layers, the transparency of anode (2) to light to be emitted should generally be set to be greater than 10%. In cases where visible light is emitted, ITO is preferably used since its transparency to visible light is high.

ITO of anode (2) may be replaced with a reflective and conductive material such as chromium and a transparent electrode such as ITO, etc., may be used instead of aluminium of cathode (1) noted hereinafter to give a top-emission constitution.

Anode (2) may be formed of only one kind of or a plurality of the above materials. Anode (2) may have a constitution consisting of a plurality of layers of the same or different composition(s).

If the resistance of anode (2) is large, an auxiliary electrode may be provided to lower the resistance. The auxiliary electrode is made of a metal such as copper, chromium, aluminium, titanium, aluminium alloy, etc., or of a laminate thereof which is partially combined with anode (2).

Anode (2) is formed of the above material(s) on substrate (1) by known thin film-forming methods such as sputtering, ion-plating, vacuum-vapor-deposition, spin-coating, electron-beam vapor-deposition, etc.

The surface of anode (2) may be cleaned with UV-ozone and/or plasma. In order to reduce short circuits and defects of the present organic EL devices, the square average of the roughness of the surface may be reduced to be 20 nm or less by methods such as fining particle sizes and polishing after film-forming.

Although depending upon materials used, the film thickness of anode (2) is selected from the ranges of in general around 5 nm-1 μm, preferably around 10 nm-1 nm, more preferably around 10 nm-500 nm, in particular around 10 nm-300 nm, and most desirably around 10 nm-200 nm.

The electric resistance per sheet of anode (2) is preferably set to be several hundreds Ω/sheet or less, more preferably, around 5-50 Ω/sheet.

Hole-Injecting Layer

Hole-injecting layer (3) may be provided between anode (2) and hole-transporting layer (4) or a luminescent layer (5, 7, or 8) noted hereinafter. Hole-injecting layer (3) transports holes from anode (2) to hole-transporting layer (4) or a luminescent layer (5, 7, or 8). Accordingly, materials for the hole-injecting layer may be those imparting this property to hole-injecting layer (3).

Materials capable of being used for hole-injecting layer (3) may be those with high performance of injecting holes. Examples include phthalocyanine derivatives, porphyrin derivatives, polythione derivatives, polythiophene derivatives, polyphenylene vinylene derivatives, star-burst amine derivatives, polyaniline derivatives, etc. Amongst these, copper phthalocyanine, non-metal phthalocyanine, etc., are preferable.

Hole-injecting layer (3) can be prepared by film-forming with these materials on anode (2) by known film-forming methods such as sputtering, ion-plating, vacuum-vapor-deposition, spin-coating, electron-beam vapor-deposition, etc.

The film thickness of hole-injecting layer (3) is preferably 3 nm-60 nm, more preferably 5 nm-30 nm.

Hole-Transporting Layer

Hole-transporting layer (4) may be provided between anode (2) or hole-injecting layer (3) and a luminescent layer (5, 7, or 8) noted hereinafter. Hole-transporting layer (4) transports holes from anode (2) or hole-injecting layer (3) to a luminescent layer (5, 7, or 8). Accordingly, materials for the hole-transporting layer may be those imparting this property to hole-transporting layer (4).

Materials capable of being used for hole-transporting layer (4) may be those with high performance of transporting holes. Examples include triamine derivatives, tetraamine derivatives, benzidine derivatives, triarylamine derivatives, arylene diamine derivatives, phenylene diamine derivatives, para-phenylene diamine derivatives, meta-phenylene diamine derivatives, 1,1-bis(4-diarylaminophenyl)cyclohexane derivatives, 4,4'-di(diarylamino)biphenyl derivatives, bis[4-(diarylamino)phenyl]methane derivatives, 4,4"-di(diarylamino)terphenyl derivatives, 4,4'''-di(diarylamino)quaterphenyl derivatives, 4,4'-di(diarylamino)diphenyl ether derivatives, 4,4'-di(diarylamino)diphenylsulphane derivatives, bis[4-(diarylamino)phenyl]dimethylmethane derivatives, bis[4-(diarylamino)phenyl]-di(trifluoromethyl)methane derivatives, etc. Amongst these, aryl di(4-diarylaminophenyl)amine derivatives, dimers, trimers, and tetramers of triphenylamine, 4,4'-bis[N-(1-naphthyl)-N-phenylamino]biphenyl, etc., are preferable.

Hole-transporting layer (4) can be prepared by film-forming with these materials on anode (2) or hole-injecting layer (3) by known film-forming methods such as sputtering, ion-plating, vacuum-vapor-deposition, spin-coating, electron-beam vapor-deposition, etc.

The film thickness of hole-transporting layer (4) is preferably 0.5 nm-200 nm, more preferably 10 nm-90 nm.

Luminescent Layers

On anode (2), hole-injecting layer (3), or hole-transporting layer (4) noted above, at least one luminescent layer (5, 7, and/or 8) is provided. Such a luminescent layer includes for example red luminescent layer (5), blue luminescent layer (7), and green luminescent layer (8). If all of these luminescent layers (5, 7, and 8) are provided, red luminescent layer (5), blue luminescent layer (7), and green luminescent layer (8) are sequentially laminated from anode (2).

Red Luminescent Layer

Red luminescent layer (5) is provided between anode (2), hole-injecting layer (3), or hole-transporting layer (4) and blue luminescent layer (7), blocking layer (6), electron-transporting layer (9), or cathode (1) noted below. Red luminescent layer (5) contains a red luminescent dopant. Accordingly, on this red luminescent dopant of red luminescent layer (5), holes from anode (2) and electrons from cathode (11) re-combine and reach an excited state, and generate red luminescence upon returning to the base state. Materials to be used for red luminescent layer (5) can be selected from any known in the art capable of generating red luminescence.

Red luminescent layer (5) preferably contains a red luminescent host and a red luminescent dopant. This efficiently allows the generation of red luminescence.

Red luminescent host materials to be used for red luminescent layer (5) are for example triamine derivatives, tetraamine derivatives, benzidine derivatives, triarylamine derivatives, arylenediamine derivatives, phenylenediamine derivatives, para-phenylenediamine derivatives, meta-phenylenediamine derivatives, 1,1-bis(4-diarylaminophenyl)cyclohexane derivatives, 4,4'-di(diarylamino)biphenyl derivatives, bis[4-(diarylamino)phenyl]methane derivatives, 4,4"-di(diarylamino)terphenyl derivatives, 4,4'''-di(diarylamino)quaterphenyl derivatives, 4,4'-di(diarylamino)diphenyl ether derivatives, 4,4'-di(diarylamino)diphenylsulphane derivatives, bis[4-(diarylamino)phenyl]dimethylmethane derivatives, bis[4-(diarylamino)phenyl]-di(trifluoromethyl)methane derivatives, etc.

Red luminescent layer (5) preferably contains at least one red dopant. This further improves whiteness, colours reproducibility, luminescent efficiency, half life of the initial luminance, etc., of the present organic EL device.

Red luminescent dopants to be contained in red luminescent layer (5) may be any capable of generating red luminescence and are for example anthracene derivatives, tetracene derivatives, pentacene derivatives, pyrene derivatives, metal complexes such as those containing europium, etc., benzopyrene derivatives, 4-(two electron-withdrawing group (EWG) substituted methylidene)-4H-pyran derivatives, 4-(two EWG substituted methylidene)-4H-thiopyran derivatives, rhodamine derivatives, benzothioxanthene derivatives, porphyrin derivatives, phenoxazone derivatives, perifranthene derivatives, etc. Amongst these, 7-diethylaminobenzo[a]phenoxazin-9H-3-one, [2-t-butyl-6-[trans-2-(2,3,5,6-tetrahydro-1,1,7,7-tetramethylbenzo[i,j]quinolidin-9-yl)ethenyl]-4H-pyran-4-ylidene]-1,3-propanedinitrile, [2-methyl-6-[trans-2-(2,3,5,6-tetrahydro-1,1,7,7-tetramethylbenzo[i,j]quinolidin-9-yl)ethenyl]-4H-pyran-4-ylidene]-1,3-propanedinitrile, dibenzotetraphenylperifranthene, etc., are preferable. Phosphorescent materials such as iridium$^{III}$ bis(2-phenylpyridine) acetylacetonate, platinum$^{II}$ 2,3,7,8,12,13,17,18-octaethyl-21H,23H-porphyrin, etc., are also preferable. Red luminescent dopants are preferably 0.5-20 weight %, more preferably 1-15 weight %, and especially 2-10 weight % of the entire red luminescent layer (5). Within these ranges, superior whiteness can be obtained.

Red luminescent layer (5) can be prepared by film-forming with these materials on anode (2), hole-injecting layer (3), or hole-transporting layer (4) by known film-forming methods such as sputtering, ion-plating, vacuum co-vapor-deposition, spin-coating, electron-beam co-vapor-deposition, etc.

The film thickness of red luminescent layer (5) is preferably 1 nm-10 nm, more preferably 1 nm-8 nm.

Blocking Layer

Between red luminescent layer (5) and blue luminescent layer (7) mentioned below, blocking layer (6) is preferably further provided. The term "blocking layer" herein means a layer to adjust the luminescent intensity of luminescent materials. Blocking layer (6) can further improve the luminescent intensity balance amongst red, blue, green, etc., by blocking electrons or holes. This further improves the whiteness, colour reproducibility, luminescent efficiency, and lifetime.

Materials to be used for blocking layer (6) may be those capable of blocking electrons such as hole-transporting materials, etc., and may be triarylamine derivatives, 4,4'-diaminobiphenyl derivatives, the numerous materials suitable for hole-transporting layer (4), etc. Amongst these, due to superior electron-blocking performance, 4,4'-bis[N-(1-naphthyl)-N-phenylamino]biphenyl, etc., are preferable. In cases blocking holes, metal phenolates, metal-quinolinolate complexes, triazole derivatives, oxazole derivatives, oxadiazole derivatives, quinoxaline derivatives, quinoline derivatives, pyrrole derivatives, benzopyrrole derivatives, tetraphenylmethane derivatives, pyrazole derivatives, thiazole derivatives, benzothiazole derivatives, thiadiazole derivatives, thionaphthene derivatives, spiro-compounds, imidazole derivatives, benzimidazole derivatives, distyrylbenzene derivatives, silole derivatives, phenanthroline derivatives, triphenylmethane derivatives, etc., are exemplified Amongst these, in particular in view of improving luminescent efficiency, electron-transporting materials which well transport electrons are preferably used such as oxadiazole derivatives, silole derivatives, phenanthroline derivatives, triphenylmethane derivatives, etc. In particular in view of elongating lifetime, electron-transporting materials whose glass transition temperature (Tg) is high are preferably used such as metal-quinolinolate complexes, etc. Especially, 2,9-dimethyl-4,7-diphenylphenanthroline, aluminium tris(8-quinolinolate), aluminium bis(2-methyl-8-quinolinolate)(4-phenylphenolate), etc., are preferably used.

Blocking layer (6) can be prepared by film-forming with these materials on red luminescent layer (5) by known film-forming methods such as sputtering, ion-plating, vacuum-vapor-deposition, spin-coating, electron-beam vapor-deposition, etc.

The film thickness of blocking layer (6) is preferably 0 nm-20 nm, more preferably 0.5 nm-20 nm. Within these ranges, superior whiteness, etc., can be obtained.

Blue Luminescent Layer

Blue luminescent layer (7) is provided between anode (2), hole-injecting layer (3), hole-transporting layer (4), red luminescent layer (5), or blocking layer (6) and green luminescent layer (8), electron-transporting layer (9), or cathode (11) mentioned below. In blue luminescent layer (7), holes from anode (2) and electrons from cathode (11) re-combine and reach an excited state, and generate blue luminescence upon returning to the base state. Materials to be used for blue luminescent layer (7) can be selected from any known in the art capable of generating blue luminescence.

Blue luminescent layer (7) preferably contains a blue luminescent host material and a blue luminescent dopant. This efficiently allows the generation of blue luminescence.

Blue luminescent host materials to be used for blue luminescent layer (7) are for example distyryl arylene derivatives, stilbene derivatives, carbazole derivatives, anthracene derivatives, triarylamine derivatives, metal-qinolinolate complexes such as aluminium bis(2-methyl-8-quinolinolate)(4-phenylphenolate), etc., 4,4'-bis(2,2-diarylvinyl)biphenyl derivatives, etc., and also phosphorescent materials such as iridium (III) bis[4,6-difluorophenylpyridinate-N,C$^{2'}$]picolinate, iridium bis[4,6-difluorophenylpyridinate-N,C$^{2'}$]acetylacetonate, etc.

Blue luminescent dopants to be used for blue luminescent layer (7) may be any capable of generating blue luminescence and can for example be pyrene derivatives, perylene derivatives, anthracene derivatives, distyrylamine derivatives, benzoxazole derivatives, metal-quinolinolate complexes, benzothiazole derivatives, benzimidazole derivatives, chrysene derivatives, phenanthrene derivatives, distyrylbenzene derivatives, distyryl arylene derivatives, divinyl arylene derivatives, tris-styryl arylene derivatives, triaryl ethylene derivatives, tetraaryl butadiene derivatives, etc. Blue luminescent dopants are preferably 0.1-15 weight %, more preferably 2-9 weight %, and especially 3-7 weight % of the whole blue luminescent layer (7).

Blue luminescent layer (7) can be prepared by film-forming with these materials on anode (2), hole-injecting layer (3), hole-transporting layer (4), red luminescent layer (5), or blocking layer (6) by known film-forming methods such as sputtering, ion-plating, vacuum-vapor-deposition, spin-coating, electron-beam vapor-deposition, etc.

The film thickness of blue luminescent layer (7) is preferably 0.6 nm-70 nm, more preferably 5 nm-60 mm.

Green Luminescent Layer

Green luminescent layer (8) is provided between anode (2), hole-injecting layer (3), hole-transporting layer (4), or blue luminescent layer (7) and electron-transporting layer (9) or cathode (11) mentioned below. In green luminescent layer (8), holes from anode (2) and electrons from cathode (11) re-combine and reach an excited state, and generate green luminescence upon returning to the base state. Materials to be used for green luminescent layer (8) can be selected from any known in the art capable of generating green luminescence.

Green luminescent layer (8) preferably contains a green luminescent host material and a green luminescent dopant. This efficiently allows the generation of green luminescence.

Green luminescent host materials to be used for green luminescent layer (8) are for example distyryl arylene derivatives, stilbene derivatives, carbazole derivatives, triarylamine derivatives, metal-qinolinolate complexes such as aluminium tris(8-quinolinolate), aluminium bis(2-methyl-8-quinolinolate), 4,4'-bis(2,2-diarylvinyl)biphenyl derivatives, etc., and also phosphorescent materials such as iridium fac-tris(2-phenylpyridine), etc.

Two of these materials can be used. As the first green luminescent host material, 4,4'-bis(2,2-diphenylvinyl)biphenyl is preferably used and as the second green luminescent host material, a metal-quinolinolate complex is preferably used. In particular, aluminium tris(8-quinolinolate) or aluminium bis(2-methyl-8-quinolinolate) are preferably used. The second green luminescent host material can be used in the range of 0-80 weight % based upon the whole green luminescent layer (8).

Green luminescent dopants to be contained in green luminescent layer (8) may be any capable of generating green luminescence and can for example be coumarin derivatives, quinacridone derivatives, metal-quinolinolate complexes, distyrylamine derivatives, 1,4-bis[2-(4-dimethylaminophenyl)vinyl]benzene, etc. Due to extremely superior green luminescence, coumarin derivatives, 1,4-bis[2-(4-dimethylaminophenyl)vinyl]benzene, etc., are preferable. Further, 6-(alkyl- or non-substituted)-8-(alkyl- or non-substituted)-7-amino-3-aryl-4-(trifluoromethyl- or non-substituted)coumarin derivatives, 1,4-bis[2-(4-dimethylaminophenyl)vinyl]benzene, etc., are preferable. In particular, considering the conjugation with the π electrons of the coumarin nucleus, the 3-aryl group of the coumarin nucleus is preferably benzothiazol-2-yl, benzimidazol-2-yl, benzoxazol-2-yl, benzoselenazol-2-yl, etc. The benzo-moiety of these aryl groups may further be substituted. Green luminescent dopants are preferably 1-15 weight % of the whole green luminescent layer (8). Within this range, superior whiteness, etc., can also be obtained.

Besides the above green luminescent host materials and dopants, green luminescent layer (8) can contain an electron-transporting material to further improve luminescent efficiency and lifetime.

Electron-transporting materials used herein are preferably those used in electron-transporting layer (9), especially the same as used in electron-transporting layer (9) or metal-quinolinolate complexes such as aluminium tris(8-quinolinolate) and aluminium (4-phenylphenolate)bis(8-quinolinolate). If these are the same as used in electron-transporting layer (9), costs can be advantageously reduced.

Such electron-transporting materials are preferably 3-60 weight %, more preferably 5-50 weight %, of the whole green luminescent layer (8).

Green luminescent layer (8) can be prepared by film-forming with these materials on anode (2), hole-injecting layer (3), hole-transporting layer (4), or blue luminescent layer (7) using known film-forming methods such as sputtering, ion-plating, vacuum-vapor-deposition, spin-coating, electron-beam vapor-deposition, etc.

The film thickness of green luminescent layer (8) is preferably 1 nm-30 nm, more preferably 2 nm-20 nm.

As described above, red, blue, and green luminescent dopants may be the derivatives least contained in the respective luminescent layers but may be defined as the derivatives of the highest fluorescent quantum yield in the respective luminescent layers.

Fluorescent quantum yields may be actually measured by using known lasers, integrating spheres, or photo-diodes. The fluorescent quantum yields of the luminescent materials of each colour actually used were measured using samples wherein the host materials and dopants of each colour were deposited with a 200 nm film thickness on a quartz substrate.

Electron-Transporting Layer

Electron-transporting layer (9) is provided between a luminescent layer (5, 7, or 8) mentioned above and electron-injecting layer (10) or cathode (11) mentioned below. Electron-transporting layer (9) transports electrons from electron-injecting layer (10) or cathode (11) to luminescent layers (5, 7, and/or 8).

Electron-transporting layer (9) may consist of one layer but preferably consists of two layers in view of few interactions such as formations of exciplexes of electron-transporting materials and luminescent layer materials and of CT complexes. This can improve luminescent efficiency and lifetime of the present organic EL devices.

In cases where electron-transporting layer (9) consists of one layer made of a single material, an electron-transporting material may be suitably chosen depending upon the required luminescent efficiency and lifetime of the present organic EL devices. In particular, metal phenolates, metal-quinolinolate complexes, triazole derivatives, oxazole derivatives, oxadiazole derivatives, quinoxaline derivatives, quinoline derivatives, pyrrole derivatives, benzopyrrole derivatives, tetraphenylmethane derivatives, pyrazole derivatives, thiazole derivatives, benzothiazole derivatives, thiadiazole derivatives, thionaphthene derivatives, spiro-compounds, imidazole derivatives, benzimidazole derivatives, distyrylbenzene derivatives, silole derivatives, phenanthroline derivatives, triphenylmethane derivatives, etc., can be exemplified.

Among these electron-transporting materials, in order to improve luminescent efficiency, oxadiazole derivatives, silole derivatives, phenanthroline derivatives, triphenylmethane derivatives, etc., which well transport electrons are preferably used. In order to elongate lifetime, metal-quinolinolate complexes, etc., whose Tg is high are preferably used. In particular, 2,9-dimethyl-4,7-diphenylphenanthroline, aluminium tris(8-quinolinolate), aluminium bis(2-methyl-8-quinolinolate)(4-phenylphenolate), etc., are preferably used.

Also in cases where electron-transporting layer (9) consists of two layers, two different electron-transporting materials from above may be suitably selected. Of the selected materials, the one with higher electron-transporting one may comprise the layer nearer to cathode (11) while the one with lower electron-transporting may comprise the layer nearer to green luminescent layer (8). The above-mentioned electron-transporting materials can be suitably used alone or in combination. This allows interactions between the better electron-transporting material and the blue luminescent layer material to be reduced and allows elongated lifetime, while maintaining luminescent efficiency, since the lower electron-transporting material functions as a buffer.

Among the above-mentioned electron-transporting materials, moderately electron-transporting materials may become ones with relatively higher or lower electron transport depending upon combination with others of the above-mentioned electron-transporting material(s). As such, combinations of the above-mentioned electron-transporting materials are based upon relative differences in electron-transporting properties.

Electron-transporting layer (9) may consist of one layer made of a mixture of the above-mentioned derivatives. This mixture is preferably homogeneous but is not necessarily homogeneous. If two of the above-mentioned materials are mixed, the lower electron-transporting one is preferably 1-70 weight %, more preferably 10-50 weight %, of the whole electron-transporting layer (9). This improves luminescent efficiency and lifetime of the present organic EL devices.

Further, electron-transporting layer (9) preferably contains at least one metal complex to give a further higher luminescent efficiency and a further longer lifetime to the present organic EL devices. Amongst such metal complexes, metal-quinolinolate complexes are preferable.

As such metal-quinolinolate complexes, besides aluminium tris(8-quinolinolate) and aluminium (4-phenylphenolate)bis(8-quinolinolate), those having as ligands 8-quinolinolate, 2-methyl-8-quinolinolate, 4-methyl-8-quinolinolate, 5-methyl-8-quinolinolate, 3,4-dimethyl-8-quinolinolate, 4-ethyl-8-quinolinolate, 4,5-dimethyl-8-quinolinolate, 4,6-dimethyl-8-quinolinolate, 4-methoxy-8-quinolinolate, benzo[h]-10-quinolinolate, benzo[f]-8-quinolinolate, dimers of 8-quinolinolate, 7-propyl-8-quinolinolate, etc., and having as central metals aluminium, beryllium, zinc, magnesium, gallium, indium, copper, calcium, tin, lead, etc., are preferably used.

In particular, metal-quinolinolate complexes are aluminium tris(8-quinolinolate), aluminium (4-phenylphenolate)bis(8-quinolinolate), aluminium tris(2-methyl-8-quinolinolate), aluminium tris(5-methyl-8-quinolinolate), aluminium (4-methyl-8-quinolinolate)bis(8-quinolinolate), aluminium (4-ethyl-8-quinolinolate)(4-methyl-8-quinolinolate)(8-quinolinolate), aluminium tris(3,4-dimethyl-8-quinolinolate), aluminium tris(4-methoxy-8-quinolinolate), aluminium tris(4,5-dimethyl-8-quinolinolate), aluminium tris (4,6-dimethyl-8-quinolinolate), aluminium tris(5-chloro-8-quinolinolate), aluminium tris(5-bromo-8-quinolinolate), aluminium tris(5,7-dichloro-8-quinolinolate), aluminium tris (5-cyano-8-quinolinolate), aluminium tris(5-sulphonyl-8-quinolinolate), aluminium tris(5-propyl-8-quinolinolate), zinc bis(8-quinolinolate), zinc bis(2-methyl-8-quinolinolate), zinc bis(2,4-dimethyl-8-quinolinolate), zinc bis(2-methyl-5-chloro-8-quinolinolate), zinc bis(2-methyl-5-cyano-8-quinolinolate), zinc bis(3,4-dimethyl-8-quinolinolate), zinc bis(4,6-dimethyl-8-quinolinolate), zinc bis(5-chloro-8-quinolinolate), zinc bis(5,7-dichloro-8-quinolinolate), zinc bis(benzo[f]-8-quinolinolate), beryllium bis(8-quinolinolate), beryllium bis(2-methyl-8-quinolinolate), beryllium bis(2,4-dimethyl-8-quinolinolate), beryllium bis(2-methyl-5-chloro-8-quinolinolate), beryllium bis(2-methyl-5-cyano-8-quinolinolate), beryllium bis(3,4-dimethyl-8-quinolinolate), beryllium bis(4,6-dimethyl-8-quinolinolate), beryllium bis(5-chloro-8-quinolinolate), beryllium bis(benzo[h]-10-quinolinolate), magnesium bis(8-quinolinolate), magnesium bis(2-methyl-8-quinolinolate), magnesium bis(2,4-dimethyl-8-quinolinolate), magnesium bis(2-methyl-5-chloro-8-quinolinolate), magnesium bis(2-methyl-5-cyano-8-quinolinolate), magnesium bis(3,4-dimethyl-8-quinolinolate), magnesium bis(4,6-dimethyl-8-quinolinolate), magnesium bis(5-chloro-8-quinolinolate), magnesium bis(5,7-dichloro-8-quinolinolate), magnesium bis(benzo[h]-10-quinolinolate), indium tris(8-quinolinolate), lithium 8-quinolinolate, gallium tris(5-chloro-8-quinolinolate), calcium bis(5-chloro-8-quinolinolate), aluminium bis(2-methyl-8-quinolinolate) triphenylsilanolate, aluminium bis(2-methyl-8-quinolinolate) diphenylmethylsilanolate, aluminium bis(2-methyl-8-quinolinolate) tert-butyldiphenylsilanolate, gallium bis(2-methyl-8-quinolinolate)[tris(4,4-biphenyl)silanolate],
gallium bis(2-methyl-8-quinolinolate) 1-naphtholate, gallium bis(2-methyl-8-quinolinolate) 2-naphtholate, copper bis (8-quinolinolate), etc. Among these, those fulfilling the above conditions well are used.

Electron-transporting layer (9) can be prepared by film-forming with the above materials on a luminescent layer (5, 7, or 8) using known film-forming methods such as sputtering, ion-plating, vacuum-vapor-deposition, spin-coating, electron-beam vapor-deposition, etc.

The thickness of electron-transporting layer (9) is preferably 1 nm-50 nm, more preferably 10 nm-40 nm.

Electron-Injecting Layer

Electron-injecting layer (10) may be provided between electron-transporting layer (9) and cathode (11) mentioned below. Electron-injecting layer (10) facilitates injection of electrons from cathode (11) into electron-transporting layer (9).

Materials to be used for electron-injecting layer (10) can be any materials that impart the above performance to electron-injecting layer (10) and are for example alkali metals such as lithium, sodium, cesium, etc., alkali earth metals such as strontium, magnesium, calcium, etc., alkali metal compounds such as lithium fluoride, lithium oxide, magnesium fluoride, calcium fluoride, strontium fluoride, barium fluoride, etc., alkali earth metal fluorides, oxides, chlorides, sulphides, etc. Amongst these, lithium fluoride is preferable. Electron-injecting layer (10) may be made of a single material or of a plurality of materials.

Electron-injecting layer (10) can be prepared by film-forming with these materials on electron-transporting layer (9) using known film-forming methods such as sputtering, ion-plating, vacuum-vapor-deposition, spin-coating, electron-beam vapor-deposition, etc.

The film thickness of electron-injecting layer (10) is preferably 0.1 nm-3 nm, more preferably 0.2 nm-1 nm.

Cathode

Cathode (11) injects electrons into a luminescent layer (5, 7, or 8), electron-transporting layer (9), or electron-injecting layer (10) mentioned above. In order to improve electron-injecting efficiency, metals, alloys, electrically conductive compounds, and mixtures thereof whose work function is for example less than 4.5 eV are used as the electrode material.

Such cathode materials are for example lithium, sodium, magnesium, silver, copper, aluminium, indium, calcium, tin, ruthenium, titanium, manganese, chromium, yttrium, aluminium-calcium alloy, aluminium-lithium alloy, aluminium-magnesium alloy, magnesium-silver alloy, magnesium-indium alloy, lithium-indium alloy, sodium-potassium alloy, magnesium/copper mixtures, aluminium/aluminium oxide mixtures, etc. The materials for anode (2) can also be used. Among them, aluminium is preferable.

When cathode (11) is provided on the light-emitting side, cathode (11) should in general be set to have a transparency of more than 10% to light to be emitted. For example, an electrode formed by lamination of a transparent conductive oxide with a very thin film of a magnesium-silver alloy is used. Upon sputtering a conductive oxide in cathode (11), in order to prevent luminescent layers (5, 7, and 8), etc., from being damaged from plasma, a buffering layer to which copperphthalocyanine, etc., has been added may be provided between cathode (11) and a luminescent layer (5, 7, or 8), electron-transporting layer (9), or electron-injecting layer (10).

When cathode (11) is used as a light-reflective electrode, materials capable of reflecting light to be emitted are suitably selected from the above materials and are generally metals, alloys, metal compounds.

Cathode (11) may be formed of only one or a plurality of the above materials. For example, addition of 1-20 weight % of silver or copper to magnesium can prevent oxidation of cathode (11) and can improve adhesion of cathode (11) to electron-injecting layer (10). Addition of 0.1-10 weight % of lithium to aluminium can improve luminescent efficiency.

Cathode (11) may consist of a plurality of layers of the same or different composition(s). In order to prevent the oxidation of cathode (11), for example, a protective layer made of a corrosion-resistant metal is provided on the side which does not contact with electron-injecting layer (10) on cathode (11).

As materials for this protective layer, for example, silver, aluminium, etc., are preferably used.

Cathode (11) can be formed on a luminescent layer (5, 7, or 8), electron-transporting layer (9), electron-injecting layer (10), or the above protective layer by known thin film-forming methods such as vacuum-vapor-deposition, sputtering, ionising-vapor-deposition, ion-plating, electron-beam vapor-deposition, etc.

The thickness of cathode (11) not including that of the above protective layer is generally around 5 nm-1 µm, preferably around 5 nm-700 nm, more particularly around 10 nm-500 nm, and most desirably 50 nm-200 nm, depending upon electrode materials actually used.

Resistance of cathode (11) preferably is adjusted to be several hundreds Ω/sheet or less.

All the above layers may further have other properties. For example, luminescent layers (5, 7, and 8) may have hole-transporting, hole-injecting, electron-injecting, and/or electron-transporting properties.

Suitable layers other than all the above layers can be further laminated.

Naturally, the present organic EL devices can also be prepared by lamination from cathode (11) on substrate (1) to anode (2).

EXAMPLES

Hereinafter, examples of the present invention and comparative examples will be described. However, the present invention naturally should not be limited to the following examples.

The following abbreviations are used.

HI: copper phthalocyanine
HT: tris[4-[N-(2-naphthyl)-N-phenylamino]phenyl]amine
RH: tris[4-[N-(3-methylphenyl)-N-phenylamino]phenyl]amine
RD: [2-t-butyl-6-[trans-2-(2,3,5,6-tetrahydro-1,1,7,7-tatramethylbenzo[i,j]quinolidin-9-yl)ethenyl]-4H-pyran-4-ylidene]-1,3-propanedinitrile
BH1: 4,4'-bis(2,2-diphenylvinyl)biphenyl
BH2: aluminium (4-phenylphenolate)bis(8-quinolinolate)
BH3: 1,6-di(5-methylnaphthalen-2-yl)anthracene
BH4: 1,1-dimethyl-3,4-di(2-methylphenyl)-2,5-di[6-(4-methylpyridin-2-yl)pyridin-2-yl]silole
BH5: 4,4'-bis(carbazol-9-yl)biphenyl
BD1: 4,4'-bis[2-(9-ethylcarbazol-2-yl)vinyl]biphenyl
BD2: 2,8-di(t-butyl)perylene
BD3: naphtho[2,1-d:1,10a-e:10a,10-f]anthracene
BD4: iridium (III) bis[4,6-difluorophenylpyridinate-N, $C^{2'}$]picolinate
GH1: aluminium tris(8-quinolinolate)
GH2: aluminium (4-phenylphenolate)bis(8-quinolinolate)
GD1: cis-2-(1,3-benzothiazol-2-yl)-3-(8-hydroxy-2,3,5,6-tetrahydro-1,1,7,7-tetramethylbenzo[i,j]quinolidin-9-yl)acrylic acid lactone
GD2: 1,4-bis[2-(4-dimethylaminophenyl)vinyl]benzene
GD3: iridium fac-tris(2-phenylpyridine)
GD4: 2,8-di(2-naphthyl)perylene
ET: 2,9-dimethyl-4,7-diphenylphenanthroline Example 1

A transparent glass, that is a substrate, on one of whose surfaces an anode made of an ITO layer of 110 nm film thickness had been formed was prepared, and washed with an alkali and then with pure water, dried, and then washed with UV-ozone.

On the anode on thus washed glass, using a vacuum-vapor-deposition apparatus (a carbon crucible, at a vapor-deposition speed of 0.1 nm/s, in vacuo around $5.0 \times 10^{-5}$ Pa), an HI layer of 10 nm film thickness was prepared to be a hole-injecting layer.

On the hole-injecting layer, using a vacuum-vapor-deposition apparatus (a carbon crucible, at a vapor-deposition speed of 0.1 nm/s, in vacuo around $5.0 \times 10^{-5}$ Pa), an HT layer of 50 nm film thickness was prepared to be a hole-transporting layer.

On the hole-transporting layer, using a vacuum-vapor-deposition apparatus (a carbon crucible, in vacuo around $5.0 \times 10^{-5}$ Pa), a layer of 5 nm film thickness was prepared by co-vapor-deposition of a host material HT and a red dopant RD to be a red luminescent layer, wherein RD was 1 weight % of the whole red luminescent layer. The co-vapor-deposition speeds for HT and RD were 0.1 nm/s and 0.001 nm/s, respectively.

On the red luminescent layer, using a vacuum-vapor-deposition apparatus (a carbon crucible, in vacuo around $5.0 \times 10^{-5}$ Pa), a layer of 30 nm film thickness was prepared by co-vapordeposition of a host material BH1 and a blue dopant BD1 to be a blue luminescent layer, wherein BD1 was 7 weight % of the whole blue luminescent layer. The co-vapor-deposition speeds for BH1 and BD1 were 0.1 nm/s and 0.0075 nm/s, respectively.

On the blue luminescent layer, using a vacuum-vapor-deposition apparatus (a carbon crucible, in vacuo around $5.0\times10^{-5}$ Pa), a layer of 10 nm film thickness was prepared by co-vapor-deposition of a host material BH1 and a green dopant GD1 to be a green luminescent layer, wherein GD1 was 6 weight % of the whole green luminescent layer. The co-vapor-deposition speeds for BH1 and GD1 were 0.1 nm/s and 0.006 nm/s, respectively.

On the green luminescent layer, using a vacuum-vapor-deposition apparatus (a carbon crucible, at a vapor-deposition speed of 0.1 nm/s, in vacuo around $5.0\times10^{-5}$ Pa), an ET layer of 30 nm film thickness was formed to be an electron-transporting layer.

On the electron-transporting layer, using a vacuum-vapor-deposition apparatus (a boron nitride crucible, at a vapor-deposition speed of 0.1 nm/s, in vacuo around $5.0\times10^{-5}$ Pa), a lithium fluoride (LiF) layer of 0.5 nm film thickness was formed to be an electron-injecting layer.

On the electron-injecting layer, using a tungsten board (at a vapor-deposition speed of 1 nm/s, in vacuo around $5.0\times10^{-5}$ Pa), an aluminium (Al) layer of 200 nm film thickness was formed to be a cathode. Finally, an organic EL device according to the present invention was prepared.

Example 1 involves as the host materials of the blue and green luminescent layers a common derivative BH1, which is a distyryl arylene derivative.

Examples 2-14

Similar to example 1, examples 2-14 involve in their blue and green luminescent layers at least one common derivative and were prepared similarly to example 1 except that their blue and green luminescent layers were changed as shown in table 1 below.

That is, examples 2-4 involve as host materials of the blue and green luminescent layers a common derivative BH1, which is a distyryl arylene derivative, similar to example 1. Examples 5-7 involve as dopants of the blue and green luminescent layers common derivatives BD1 and GD2 (a distyrylamine derivative), respectively. Examples 8 and 9 involve as host materials of the blue and green luminescent layers common derivatives BH2 and GH1 (a metal-quinolinolate complex), respectively. Example 10 involves as host materials of the blue and green luminescent layers a common derivative BH5 a carbazole derivative). Example 11 involves as host materials of the blue and green luminescent layers a common derivative BH3 (an anthracene derivative). Example 12 involves as host materials of the blue and green luminescent layers a common derivative BH4 (a silole derivative). Example 13 involves as host materials of the blue and green luminescent layers a common derivative HT (a triphenylamine derivative). Example 14 involves as dopants of the blue and green luminescent layers common derivatives BD2 and GD4 (a perylene derivative), respectively.

All the electron-transporting layers of examples 1-14 form one layer constitutions made of a single material.

Example 15

Example 15 was prepared similarly to example 1 except that a blocking layer of 3 nm film thickness of HT vapor-deposited was provided between the blue and red luminescent layers. Example 15 also involved as host materials of the blue and green luminescent layers a common derivative BH1 (a distyryl arylene derivative).

Examples 16-20

Examples 16-20 were prepared similarly to example 1 except that the blue luminescent layer, green luminescent layer, and electron-transporting layer were changed as shown in table 1 below. Examples 16-20 also involved as host materials of the blue and green luminescent layers a common derivative BH1 (a distyryl arylene derivative).

Example 16 used GH1 to form an electron-transporting layer and BD2 as the blue dopant of the blue luminescent layer.

The green luminescent layers of examples 17 and 18 additionally contain a metal-quinolinolate complex GH1. GH1 is 40 weight % based upon the entire green luminescent layers. The vapor-deposition speeds for BH1, GH1, and GD1 were 0.54 nm/s, 0.4 nm/s, and 0.06 nm/s, respectively.

The electron-transporting layer of example 19 forms a two-layer structure wherein from the cathode ET and GH1 are sequentially laminated. Both are of 15 nm film thickness. The vapor-deposition speeds for ET and GH were 0.1 nm/s and 0.04 nm/s, respectively.

The electron-transporting layer of example 20 forms a mixed one layer structure made of ET and GH1 (ET: GH1=50 weight %:50 weight %).

Examples 21-26

As shown in table 1 below, examples 21-26 were prepared similarly to example 1 except that no hole-transporting layer was provided and that ET contained in the green luminescent layers was increased from 0 to 60 weight %. Examples 21-26 also involve as host materials of the blue and green luminescent layers a common derivative BH1 (a distyryl arylene derivative).

In example 21, BH1 and BD1 were co-vapor-deposited to form the blue luminescent layer wherein the blue dopant BD1 is 5 weight % based upon the entire blue luminescent layer. BH1 and GD1 were co-vapor-deposited to form the green luminescent layer wherein the green dopant GD1 is 5 weight % based upon the entire green luminescent layer.

Example 22 is the same as example 21 except that BH1, ET, and GD1 were co-vapor-deposited to form the green luminescent layer wherein BH1 was 92 weight %, ET was 3 weight %, and GD1 was 5 weight %.

Example 23 is the same as example 21 except that BH1, ET, and GD1 were co-vapor-deposited to form the green luminescent layer wherein BH1 was 90 weight %, ET was 5 weight %, and GD1 was 5 weight %.

Example 24 is the same as example 21 except that BH1, ET, and GD1 were co-vapor-deposited to form the green luminescent layer wherein BH1 was 75 weight %, ET was 20 weight %, and GD1 was 5 weight %.

Example 25 is the same as example 21 except that BH1, ET, and GD1 were co-vapor-deposited to form the green luminescent layer wherein BH1 was 45 weight %, ET was 50 weight %, and GD1 was 5 weight %.

Example 26 is the same as example 21 except that BH1, ET, and GD1 were co-vapor-deposited to form the green luminescent layer wherein BH1 was 35 weight %, ET was 60 weight %, and GD1 was 5 weight %.

That is, the green luminescent layers of examples 21-26 contain a hole-transporting material BH1, an electron-transporting material ET, and a luminescent dopant GD1.

Examples 27-32

Example 27 was a green luminescent organic EL device as shown in table 1 below and was prepared similarly to example 1 except that a blue luminescent layer, a blocking layer, a red luminescent layer, and a hole-transporting layer were not provided.

Example 28 was the same as example 27 except that the green luminescent layer was formed by co-vapor-deposition of 91 weight % of BH1, 3 weight % of GH1, and 6 weight % of GD1.

Example 29 was the same as example 27 except that the green luminescent layer was formed by co-vapor-deposition of 89 weight % of BH1, 5 weight % of GH1, and 6 weight % of GD1.

Example 30 was the same as example 27 except that the green luminescent layer was formed by co-vapor-deposition of 74 weight % of BH1, weight % of GH1, and 6 weight % of GD1.

Example 31 was the same as example 27 except that the green luminescent layer was formed by co-vapor-deposition of 44 weight % of BH1, 50 weight % of GH1, and 6 weight % of GD1.

Example 32 was the same as example 27 except that the green luminescent layer was formed by co-vapor-deposition of 34 weight % of BH1, 60 weight % of GH1, and 6 weight % of GD1.

That is, the green luminescent layers of examples 27-32 contain a hole-transporting material BH1, an electron-transporting material GH1, and a luminescent dopant GD1.

Comparative Example 1

The blue and green luminescent host materials of comparative example 1 did not contain a common derivative. An organic EL device was prepared similarly to example 1 except that the blue luminescent host material was replaced with BH2. See also table 2 below.

Comparative Example 2

The blue and green luminescent host materials of comparative example 2 did not contain a common derivative. An organic EL device was prepared similarly to example 1 except that the green luminescent host material was replaced with GH1. See also table 2 below.

Comparative Examples 3-7

Comparative examples 3-7 were prepared similarly to example 1 except that the laminating order of the red, blue, and green luminescent layers was changed. See also table 2 below.

The organic EL devices prepared in examples 1-32 and comparative examples 1-7 were sealed with a glass cap. Their anode and cathode were connected by a known drive circuit. Whiteness (x, y) and luminescent efficiency at 1,000 cd/m$^2$ luminance under room temperature (RT) and half life of initial luminance were measured. Half life of initial luminance is the duration until the initial luminance of 5,500 cd/m$^2$ under RT decreases to the half (2,750 cd/m$^2$) with applying the current. The luminance was measured by a luminance measuring apparatus (manufactured by Topcon K.K., trade name BM7). Further, variation of whiteness (x, y) from the initial measurement till the luminance half-decreased was also calculated by the following equation:

$$\text{Variation of Whiteness} = [(\text{variation in } x)^2 + (\text{variation in } y)^2]^{1/2}$$

The results of these measurements and calculations are given based upon example 1 in Tables 1 and 2 below.

TABLE 1

| structures | | thickness (nm) | example 1 | example 2 | example 3 | example 4 | example 5 | example 6 | example 7 | example 8 | example 9 |
|---|---|---|---|---|---|---|---|---|---|---|---|
| structures | cathode | 200 | Al | ← | ← | ← | ← | ← | ← | ← | ← |
| | electron-injecting layer | 0.5 | LiF | ← | ← | ← | ← | ← | ← | ← | ← |
| | electron-transporting layer | 30 | ET | ← | ← | ← | ← | ← | ← | ← | ← |
| | green luminescent layer | green host | 10 | BH1 | ← | ← | ← | GH1 | ← | GH2 | GH1 | ← |
| | | green dopant | | 6% GD1 | ← | ← | ← | 6% GD2 | ← | ← | 6% GD1 | 6% GD2 |
| | blue luminescent layer | blue host | 30 | BH1 | ← | ← | ← | ← | HT | BH5 | BH2 | ← |
| | | blue dopant | | 7% BD1 | 7% BD2 | 7% BD3 | 7% BD4 | 7% BD1 | 7% BD1 | 7% BD1 | 7% BD2 | ← |
| | blocking layer | | 0 | | | | | | | | | |
| | red luminescent layer | red host | 5 | HT | ← | ← | ← | ← | ← | ← | ← | ← |
| | | red dopant | | 1% RD | ← | ← | ← | ← | ← | ← | ← | ← |
| | hole-transporting layer | | 50 | HT | ← | ← | ← | ← | ← | ← | ← | ← |
| | hole-injecting layer | | 10 | HI | ← | ← | ← | ← | ← | ← | ← | ← |
| | anode | | 110 | ITO | ← | ← | ← | ← | ← | ← | ← | ← |
| | substrate | | | glass | ← | ← | ← | ← | ← | ← | ← | ← |
| | chromaticity x | | | 0.328 | 0.329 | 0.323 | 0.329 | 0.335 | 0.325 | 0.324 | 0.336 | 0.326 |
| | chromaticity y | | | 0.328 | 0.329 | 0.328 | 0.329 | 0.325 | 0.328 | 0.329 | 0.325 | 0.329 |
| | variation of chromaticity Δ | | | 0.0034 | 0.0033 | 0.0034 | 0.0030 | 0.0046 | 0.0039 | 0.0044 | 0.0049 | 0.0040 |
| | luminescent efficiency | | | 1.000 | 0.984 | 1.065 | 1.081 | 0.984 | 1.065 | 1.048 | 1.048 | 1.048 |
| | lifetime | | | 1.000 | 0.959 | 1.000 | 0.946 | 0.981 | 1.030 | 0.986 | 0.984 | 1.030 |

TABLE 1-continued

| | | thickness (nm) | example 10 | example 11 | example 12 | example 13 | example 14 | example 15 | example 16 | example 17 | example 18 |
|---|---|---|---|---|---|---|---|---|---|---|---|
| structures | cathode | 200 | ← | Al | ← | ← | ← | ← | ← | ← | ← |
| | electron-injecting layer | 0.5 | ← | LiF | ← | ← | ← | ← | ← | ← | ← |
| | electron-transporting layer | 30 | ← | ET | ← | ← | ← | ← | GH1 | ← | ← |
| green luminescent layer | green host | 10 | BH5 | BH3 | BH4 | HT | GH1 | BH1 | ← | BH1 + 40% GH1 | BH1 + 40% GH2 |
| | green dopant | | 6% GD3 | 6% GD1 | 6% GD2 | 6% GD1 | 6% GD4 | 6% GD1 | ← | ← | ← |
| blue luminescent layer | blue host | 30 | BH5 | BH3 | BH4 | HT | BH1 | ← | ← | ← | ← |
| | blue dopant | | 7% BD4 | 7% BD1 | 7% BD2 | 7% BD3 | 7% BD2 | 7% BD1 | 7% BD2 | 7% BD3 | ← |
| | blocking layer | 3 | | | | | | HT | | | |
| red luminescent layer | red host | 5 | ← | HT | ← | ← | ← | ← | ← | ← | ← |
| | red dopant | | ← | 1% RD | ← | ← | ← | ← | ← | ← | ← |
| | hole-transporting layer | 50 | ← | HT | ← | ← | ← | ← | ← | ← | ← |
| | hole-injecting layer | 10 | ← | HI | ← | ← | ← | ← | ← | ← | ← |
| | anode | 110 | ← | ITO | ← | ← | ← | ← | ← | ← | ← |
| | substrate | | ← | glass | ← | ← | ← | ← | ← | ← | ← |
| | chromaticity x | | 0.327 | 0.328 | 0.328 | 0.335 | 0.323 | 0.330 | 0.322 | 0.327 | 0.327 |
| | chromaticity y | | 0.329 | 0.329 | 0.326 | 0.329 | 0.331 | 0.327 | 0.327 | 0.326 | 0.329 |
| | variation of chromaticity Δ | | 0.0035 | 0.0036 | 0.0036 | 0.0044 | 0.0037 | 0.0030 | 0.0044 | 0.0040 | 0.0043 |
| | luminescent efficiency | | 1.016 | 1.048 | 0.984 | 0.984 | 1.081 | 0.968 | 1.048 | 0.968 | 1.016 |
| | lifetime | | 0.989 | 1.033 | 0.967 | 1.016 | 0.978 | 0.986 | 0.951 | 0.978 | 0.981 |

| | | thickness (nm) | example 19 | example 20 | example 21 | example 22 | example 23 | example 24 | example 25 | example 26 |
|---|---|---|---|---|---|---|---|---|---|---|
| structures | cathode | 200 | ← | ← | Al | ← | ← | ← | ← | ← |
| | electron-injecting layer | 0.5 | ← | ← | LiF | ← | ← | ← | ← | ← |
| | electron-transporting layer | 30 | GH1/ET | GH1 + ET | ET | ← | ← | ← | ← | ← |
| green luminescent layer | green host | 10 | BH1 | ← | BH1 | BH1 + 3% ET | BH1 + 5% ET | BH1 + 20% ET | BH1 + 50% ET | BH1 + 60% ET |
| | green dopant | | ← | ← | 5% GD1 | ← | ← | ← | ← | ← |
| blue luminescent layer | blue host | 30 | | | BH1 | | | | | |
| | blue dopant | | ← | ← | 5% BD1 | ← | ← | ← | ← | ← |
| | blocking layer | 0 | | | | | | | | |
| red luminescent layer | red host | 5 | ← | ← | HT | ← | ← | ← | ← | ← |
| | red dopant | | ← | ← | 1% RD | ← | ← | ← | ← | ← |
| | hole-transporting layer | 0 | ← | ← | | | | | | |
| | hole-injecting layer | 10 | ← | ← | HI | ← | ← | ← | ← | ← |
| | anode | 110 | ← | ← | ITO | ← | ← | ← | ← | ← |
| | substrate | | ← | ← | glass | ← | ← | ← | ← | ← |
| | chromaticity x | | 0.328 | 0.331 | 0.328 | 0.325 | 0.325 | 0.322 | 0.321 | 0.318 |
| | chromaticity y | | 0.326 | 0.330 | 0.328 | 0.322 | 0.322 | 0.323 | 0.321 | 0.319 |
| | variation of chromaticity Δ | | 0.0046 | 0.0034 | 0.0034 | 0.0032 | 0.0032 | 0.0031 | 0.0032 | 0.0031 |
| | luminescent efficiency | | 1.016 | 1.065 | 1.048 | 1.065 | 1.210 | 1.258 | 1.274 | 1.113 |
| | lifetime | | 1.003 | 0.949 | 0.729 | 0.737 | 0.846 | 0.867 | 0.954 | 0.951 |

| | | thickness (nm) | example 27 | example 28 | example 29 | example 30 | example 31 | example 32 |
|---|---|---|---|---|---|---|---|---|
| structures | cathode | 200 | Al | ← | ← | ← | ← | ← |
| | electron-injecting layer | 0.5 | LiF | ← | ← | ← | ← | ← |
| | electron-transporting layer | 30 | ET | ← | ← | ← | ← | ← |
| green luminescent layer | green host | 10 | BH1 | BH1 + 3% GH1 | BH1 + 5% GH1 | BH1 + 20% GH1 | BH1 + 50% GH1 | BH1 + 60% GH1 |
| | green dopant | | 6% GD1 | ← | ← | ← | ← | ← |
| blue luminescent layer | blue host | 0 | | | | | | |
| | blue dopant | | | | | | | |

TABLE 1-continued

| | | | | | | | | |
|---|---|---|---|---|---|---|---|---|
| blocking layer | | 0 | | | | | | |
| red luminescent layer | red host | 0 | | | | | | |
| | red dopant | | | | | | | |
| hole-transporting layer | | 0 | | | | | | |
| hole-injecting layer | | 10 | HI | ← | ← | ← | ← | ← |
| anode | | 110 | ITO | ← | ← | ← | ← | ← |
| substrate | | | glass | ← | ← | ← | ← | ← |
| chromaticity x | | | 0.283 | 0.281 | 0.279 | 0.284 | 0.281 | 0.280 |
| chromaticity y | | | 0.682 | 0.681 | 0.684 | 0.685 | 0.681 | 0.682 |
| luminescent efficiency | | | 1.113 | 1.161 | 1.274 | 1.355 | 1.371 | 1.290 |
| lifetime | | | 1.924 | 1.978 | 2.195 | 2.276 | 2.290 | 2.304 |

TABLE 2

| | | thickness (nm) | comparative 1 | comparative 2 | | | thickness (nm) | comparative 3 | | | thickness (nm) | comparative 4 |
|---|---|---|---|---|---|---|---|---|---|---|---|---|
| structures | cathode | 200 | Al | ← | cathode | | 200 | Al | cathode | | 200 | Al |
| | electron-injecting layer | 0.5 | LiF | ← | electron-injecting layer | | 0.5 | LiF | electron-injecting layer | | 0.5 | LiF |
| | electron-transporting layer | 30 | ET | ← | electron-transporting layer | | 30 | ET | electron-transporting layer | | 30 | ET |
| | green luminescent layer | green host | 10 | BH1 | GH1 | blue luminescent layer | blue host | 30 | BH1 | green luminescent layer | green host | 10 | BH1 |
| | | green dopant | | GD1 | GD1 | | blue dopant | | BD1 | | green dopant | | GD1 |
| | blue luminescent layer | blue host | 30 | BH2 | BH1 | green luminescent layer | green host | 10 | BH1 | red luminescent layer | red host | 5 | HT |
| | | blue dopant | | BD1 | BD1 | | green dopant | | GD1 | | red dopant | | RD |
| | blocking layer | | 0 | — | — | blocking layer | | 0 | — | blocking layer | | 0 | — |
| | red luminescent layer | red host | 5 | HT | ← | red luminescent layer | red host | 5 | HT | blue luminescent layer | blue host | 30 | BH1 |
| | | red dopant | | RD | ← | | red dopant | | RD | | blue dopant | | BD1 |
| | hole-transporting layer | | 50 | HT | ← | hole-transporting layer | | 50 | HT | hole-transporting layer | | 50 | HT |
| | hole-injecting layer | | 10 | HI | ← | hole-injecting layer | | 10 | HI | hole-injecting layer | | 10 | HI |
| | anode | | 110 | ITO | ← | anode | | 110 | ITO | anode | | 110 | ITO |
| | substrate | | | glass | ← | substrate | | | glass | substrate | | | glass |
| | chromaticity x | | | 0.301 | 0.291 | chromaticity x | | | 0.293 | chromaticity x | | | 0.299 |
| | chromaticity y | | | 0.312 | 0.321 | chromaticity y | | | 0.328 | chromaticity y | | | 0.313 |
| | variation of chromaticity Δ | | | 0.011 | 0.013 | variation of chromaticity Δ | | | 0.021 | variation of chromaticity Δ | | | 0.013 |
| | luminescent efficiency | | | 0.823 | 0.774 | luminescent efficiency | | | 0.839 | luminescent efficiency | | | 0.661 |
| | lifetime | | | 0.789 | 0.659 | lifetime | | | 0.794 | lifetime | | | 0.577 |

| | | thickness (nm) | comparative 5 | | | thickness (nm) | comparative 6 | | | thickness (nm) | comparative 7 |
|---|---|---|---|---|---|---|---|---|---|---|---|
| structures | cathode | 200 | Al | cathode | | 200 | Al | cathode | | 200 | Al |
| | electron-injecting layer | 0.5 | LiF | electron-injecting layer | | 0.5 | LiF | electron-injecting layer | | 0.5 | LiF |
| | electron-transporting layer | 30 | ET | electron-transporting layer | | 30 | ET | electron-transporting layer | | 30 | ET |
| | red luminescent layer | red host | 5 | HT | red luminescent layer | red host | 5 | HT | blue luminescent layer | blue host | 30 | BH1 |
| | | red dopant | | RD | | red dopant | | RD | | blue dopant | | BD1 |
| | green luminescent layer | green host | 10 | BH1 | blue luminescent layer | blue host | 30 | BH1 | red luminescent layer | red host | 5 | HT |
| | | green dopant | | GD1 | | blue dopant | | BD1 | | red dopant | | RD |
| | blocking layer | | 0 | — | blocking layer | | 0 | — | blocking layer | | 0 | — |
| | blue luminescent layer | blue host | 30 | BH1 | green luminescent layer | green host | 10 | BH1 | green luminescent layer | green host | 10 | BH1 |
| | | blue dopant | | BD1 | | green dopant | | GD1 | | green dopant | | GD1 |
| | hole-transporting layer | | 50 | HT | hole-transporting layer | | 50 | HT | hole-transporting layer | | 50 | HT |

TABLE 2-continued

| hole-injecting layer | 10 | HI | hole-injecting layer | 10 | HI | hole-injecting layer | 10 | HI |
|---|---|---|---|---|---|---|---|---|
| anode | 110 | ITO | anode | 110 | ITO | anode | 110 | ITO |
| substrate | | glass | substrate | | glass | substrate | | glass |
| chromaticity x | | 0.352 | chromaticity x | | 0.331 | chromaticity x | | 0.311 |
| chromaticity y | | 0.329 | chromaticity y | | 0.298 | chromaticity y | | 0.292 |
| variation of chromaticity Δ | | 0.012 | variation of chromaticity Δ | | 0.022 | variation of chromaticity Δ | | 0.017 |
| luminescent efficiency | | 0.839 | luminescent efficiency | | 0.742 | luminescent efficiency | | 0.758 |
| lifetime | | 0.748 | lifetime | | 0.656 | lifetime | | 0.734 |

Evaluations

Each of the organic EL devices of examples 1-20 gave excellent whiteness and had sufficiently small variation. They had also excellent luminescent efficiency and excellent lifetime.

By contrast, the organic EL devices wherein the host materials of the blue and green luminescent layers did not contain any common derivative (comparative examples 1 and 2) had bad whiteness, bad luminescent efficiency, and shorter lifetime than example 1.

Comparative examples 3-7, wherein the laminating order of the red, blue, and green luminescent layers was changed, also had bad whiteness, bad luminescent efficiency, and shorter lifetime than example 1.

All the organic EL devices of examples 21-26 gave excellent white colour and had sufficiently small variation. The luminescent efficiency and lifetime were also excellent.

Further, examples 22-26 containing in their green luminescent layer an electron-transporting material ET are found to further improve luminescent efficiency and lifetime compared to example 21 not containing ET in the green luminescent layer.

All the organic EL devices of examples 27-32 gave excellent green colour and had sufficiently small variation. The luminescent efficiency and lifetime were also excellent.

Further, examples 28-32 containing in their green luminescent layer an electron-transporting material GH1 are found to further improve luminescent efficiency and lifetime compared to example 27 not containing GH1 in the green luminescent layer.

As seen from comparison of table 1 to table 2, all the chromaticity coordinates of the luminescent colour from the present organic EL devices showed excellent whiteness and greenness. By contrast, the comparative organic EL devices did not give good whiteness.

The present organic EL devices had much improved luminescent efficiency and lifetime compared to the comparative organic EL devices.

Accordingly, in the organic EL devices of examples 1-26, excellent whiteness as well as high luminescent efficiency and long lifetime have been obtained by sequentially providing from the anode side a red luminescent layer, a blue luminescent layer, a green luminescent layer, an electron-transporting layer, and a cathode and that at least one derivative contained in the blue and green luminescent layers is common.

In the organic EL devices of examples 27-32, excellent greenness as well as high luminescent efficiency and long lifetime have been obtained by sequentially providing from the anode side a green luminescent layer, an electron-transporting layer, and a cathode.

The invention claimed is:

1. An organic EL device having at least a red luminescent layer, a blue luminescent layer, a green luminescent layer, and a cathode sequentially provided on an anode in this order wherein the red luminescent layer contains only a red luminescent dopant as a luminescent dopant, the blue luminescent layer contains only a blue luminescent dopant as a luminescent dopant, the green luminescent layer contains only a green luminescent dopant as a luminescent dopant, the blue luminescent dopant and the green luminescent dopant contain at least one common derivative, and the common derivative is selected from the group consisting of metal-quinolinolate complexes, pyrene derivatives, perylene derivatives, distyrylamine derivatives, anthracene derivatives, silole derivatives and triphenylamine derivatives.

2. An organic EL device of claim 1 wherein an electron-transporting layer is further provided between the green luminescent layer and the cathode.

3. An organic EL device of claim 1 wherein a blocking layer is further provided between the red luminescent layer and the blue luminescent layer.

4. An organic EL device of claim 2 wherein the electron-transporting layer consists of one layer.

5. An organic EL device of claim 2 wherein the electron-transporting layer consists of two electron-transporting layers.

6. An organic EL device of claim 5 wherein of the two electron-transporting layers, the electron-transporting layer nearer to the anode is made of aluminium tris(8-quinolinolate) and the electron-transporting layer nearer to the cathode is made of a phenanthroline derivative or a triphenylmethane derivative.

7. An organic EL device of claim 2 wherein the electron-transporting layer is a mixture layer made of a plurality of derivatives.

8. An organic EL device of claim 4 wherein the electron-transporting layer contains at least one metal complex.

9. An organic EL device of claim 1 containing a phosphorescent material.

* * * * *